(12) United States Patent
Riege

(10) Patent No.: US 8,546,048 B2
(45) Date of Patent: Oct. 1, 2013

(54) FORMING SLOPED RESIST, VIA, AND METAL CONDUCTOR STRUCTURES USING BANDED RETICLE STRUCTURES

(75) Inventor: Jens Albrecht Riege, Ojai, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 231 days.

(21) Appl. No.: 13/284,280

(22) Filed: Oct. 28, 2011

(65) Prior Publication Data

US 2012/0145668 A1 Jun. 14, 2012

Related U.S. Application Data

(60) Provisional application No. 61/408,277, filed on Oct. 29, 2010.

(51) Int. Cl.
*G03F 7/00* (2006.01)
*G03F 1/68* (2012.01)

(52) U.S. Cl.
USPC .............................. 430/5; 430/325

(58) Field of Classification Search
USPC .................. 430/5, 325, 326; 216/41
See application file for complete search history.

(56) References Cited

U.S. PATENT DOCUMENTS

| | | | |
|---|---|---|---|
| 4,919,748 A | 4/1990 | Bredbenner et al. | |
| 6,326,106 B1 * | 12/2001 | Kitagawa | 430/5 |
| 7,354,681 B2 | 4/2008 | Laidig et al. | |
| 2005/0277067 A1 | 12/2005 | Chen et al. | |
| 2009/0246648 A1 | 10/2009 | Yen et al. | |

OTHER PUBLICATIONS

Konstantinos Adam et al.; Effect of Reticle CD Uniformity on Wafer CD Uniformity in the Presence of Scattering Bar Optical Proximity Correction; Proc. SPIE, 18th Annual BACUS Symposium on Photomask Technology and Management; 1998; vol. 3546, p. 642-650; California USA.

* cited by examiner

*Primary Examiner* — Stephen Rosasco

(57) ABSTRACT

A technique generating sloping resist profiles based on an exposure process uses a reticle having structures surrounded with first and second contrasting interleaved bands below the resolution limit of the stepper used to expose the resist. Exemplary embodiments include a reticle having interleaved, non-overlapping transparent and opaque bands surrounding a transparent feature with an innermost one of the opaque bands bordering the structure, such as a via opening or a metal conductors pattern, resulting in the patterned photoresist having sloped or tapered sides with consistent reproducibility. The slope in the photoresist is then transferred to the underlying layer during an etch using the tapered photoresist as a mask. Alternatively, the sloped resist can have a negative slope angle for patterning metal conductors using a metal lift-off technique.

32 Claims, 12 Drawing Sheets

RADIAL LINES

GRID ARRAY

DOUBLE/SINGLE

SINGLE/SINGLE

DOUBLE/DOUBLE

FORMING SLOPED RESIST, VIA, AND METAL CONDUCTOR STRUCTURES USING BANDED RETICLE STRUCTURES

BACKGROUND OF THE INVENTION

1. Field of the Invention

The present invention relates to photolithography generally, and, in particular, to reticle structures for controlling resist profile slope.

2. Description of the Related Art

In many integrated circuit and nanostructure (e.g., MEMS device and magnetic disk head) manufacturing processes, it is desirable to produce features on the surface of the resulting device that are smoothed or tapered. For example, evaporated metal deposited over sharp topographical features, such as sharp-edged vias, generally do not deposit in a continuous film and might deposit too thinly at the edge of the via for reliable device operation. Where current densities are sufficiently high that electromigration of the metal can occur, the thin metal layer may retract over time until the metal is too thin to carry the current flowing therein, causing the device to fail before the design lifetime of the device. Even where electromigration is not an issue, the thinned metal layer can form cracks that make the manufactured device susceptible to moisture ingression, which might induce corrosion of the metal, reducing device reliability. The sharp features come about because resist patterns used to form the features underlying the metal, when viewed immediately after the resist is patterned and developed, often have near-vertical sidewall profiles when the process focus and exposure are optimized for critical dimension process control.

Another concern in integrated circuit and nanostructure manufacturing involves the deposition of a dielectric layer over metal conductors. If the slope of the sides of the metal conductors are essentially perpendicular or have negative slope due to undercutting of the metal layer during etching of the metal layer used to form the conductors, the dielectric layer might contain voids formed during deposition of the dielectric over the metal conductors, causing reliability problems because of moisture ingression in the voids causing corrosion to the metal layers. Further, the dielectric layer may not adhere to the metal layer sufficiently to avoid moisture ingression along the dielectric-metal interface.

It is therefore advantageous to have a gradually sloping under-layer so that the layer deposited on the under-layer smoothly and uniformly follows the contour of the under-layer. In one example, it is desirable to have an etched contact via opening with a gradual slope to assist with depositing an even metal film during the metal contact formation.

Generally, there are two known techniques to provide an under-layer with sloped sides. The first technique involves creating a protective layer along the sidewall of the layer being etched, thereby creating a tapered, non-vertical sidewall. The second technique involves forming a slope in the sidewall of a patterned photoresist layer used to mask the layer being etched, and then transferring the slope from the photoresist sidewall to the etched layer sidewall during a conventional etching step. There are multiple variants on the latter technique as will be discussed below.

The first technique mentioned above regarding the use of a protective layer to creating a taper to a dielectric or a metal layer is to form, during the etch, a protective polymeric layer on the sidewall of the material layer being etched. One example of this technique is disclosed in U.S. Pat. No. 4,919,748 for taper etching of an aluminum layer using a polymeric layer formed by adjusting the etch process parameters and gases during the etch. However, this technique utilizes a transient etch-resistant film on the layer being etched that might not create uniformly sloped aluminum sidewalls across a wafer and involves the etching of aluminum, not a dielectric. Further, the non-uniformity or variance of the taper angle is additive to the exposure process variations and might worsen critical dimension (CD) uniformity. Hence, the technique of using sloped photoresist sidewalls to create a sloped underlayer is generally preferred.

The second technique mentioned above is to create a sloped photoresist sidewall before etching of the underlying layer occurs. One approach to create the sloped resist profile is to "hard bake" the patterned resist, such as subjecting a novolac-based resist to temperatures between 120 and 130° C. using an oven bake, or a hotplate bake. At these temperatures, the resist softens and begins to flow at the edges of the patterns. Above this temperature range the resist hardens so much that the resist becomes too hard to be removed after use with reasonable effort, and, if baked at too high a temperature and for too long a time, the resist may begin to cure such that resist removal becomes extremely difficult. Oven temperature uniformity can be difficult to control across the oven, sometimes varying up to +/4° C. This variation across a wafer lot, and across multiple lots loaded together in the oven, generates a wide range of slope non-uniformity. A hotplate bake process provides better uniformity between wafers with temperature control ranging +/−0.5° C. or better. However, a hard bake process variation to the resist profile is additive to the variation due just to the exposure process.

Another approach to create a sloped photoresist profile is to defocus the exposure of the resist during patterning. This method limits the slope variation to just the exposure process, but large offsets can result in a loss in critical dimension control for a contact via opening defined by the sloped photoresist. For example, a 2.5 um resist photo process over a polyimide film, a 2 um square via reticle feature can result in a round via pattern with a sloped profile of about 80 degrees from vertical when the image is defocused during exposure at −1.5 um. It is also possible to get a resist sidewall angle of 77 degrees with a defocus of −3 um, but it has been found that this amount of defocus makes it difficult to control via opening dimensions at the bottom of a via. Additionally, focus control at the edge of the wafer can be difficult with some steppers. At the edges of the wafer, the laser focus algorithms in the stepper generally do not have enough data to calculate stepper field planarity and must average focus measurements from partial data or use data from adjacent stepper fields. The variation in focus at the edge of the wafer can generate inconsistent resist sloped profiles and can generate poor CD uniformity which increases when defocusing resist exposure is used to generate a sloped profile.

One additional approach to create a sloped photoresist profile is to use a dry-etch process to erode the edges of the resist as the chemical components of the etch chemically removes the underlying film layer. Since the etch rate is not uniform across the wafer, the resist is erroded non-uniformly during the etch. The resist non-uniformity is then added to the non-uniformity of the etch of the layer under the resist. Like the protective polymeric layer approach discussed above, the variation of this process on the sloped profile is also additive to the variation due to the exposure process and might worsen CD uniformity.

Unfortunately, none of the above sloped resist profile approaches result in a uniform and controllable tapered profile to via or other types of openings in dielectric material layers or on sidewalls of conductive layers. Thus, another approach is needed that allows for uniform, controllable sidewall profile angles for dielectric or conductive layers in integrated circuits or nanostructures, without significantly impacting CD uniformity across the wafer.

SUMMARY

This Summary is provided to introduce a selection of concepts in a simplified form that are further described below in the Detailed Description. This Summary is not intended to identify key features or essential features of the claimed subject matter, nor is it intended to limit the scope of the claimed subject matter.

In one embodiment, a reticle intended for use in a stepper having a resolution limit has at least one structure thereon with a first transmissivity. The reticle has at least one structure thereon with a first transmissivity, a plurality of first bands that border and surround the structure, and a plurality of second bands corresponding to the first bands. Each of the first bands has a transmissivity different from the first transmissivity and a width smaller than the resolution limit of the stepper. Each of the second bands has the first transmissivity and a width smaller than the resolution limit of the stepper.

In another embodiment, a method of making an device comprises the steps of providing a stepper having a resolution limit, depositing a layer of photoresist on a layer of material to be patterned, exposing the photoresist to light in a stepper using a reticle to form a latent image of the reticle in the exposed photoresist, developing the latent image in the exposed photoresist, and etching the material layer using the developed photoresist as an etch mask. The reticle has at least one structure thereon with a first transmissivity, a plurality of first bands that border and surround the structure, and a plurality of second bands corresponding to the first bands. Each of the first bands has a transmissivity different from the first transmissivity and a width smaller than the resolution limit of the stepper. Each of the second bands has the first transmissivity and a width smaller than the resolution limit of the stepper. The first and second bands together operate to control the slope of the photoresist sidewalls.

In another embodiment, a making a device comprises the steps of providing a stepper having a resolution limit, depositing a layer of photoresist on a substrate, exposing the photoresist to light in a stepper using a reticle to form a latent image of the photoresist in the exposed photoresist, developing the latent image in the exposed photoresist, depositing a layer of metal on the developed photoresist and exposed portions of the substrate, and removing the photoresist and the layer of metal on the developed photoresist. The reticle has at least one transparent structure thereon defining an opening to be formed in the photoresist. A plurality of opaque non-overlapping first bands having a width smaller than the resolution limit of the stepper borders and surrounds the structure on the reticle. In addition, a plurality of transparent non-overlapping second bands having a width smaller than the resolution limit of the stepper and equal to in number and interleaved with the first bands also surrounds the structure on reticle. The exposed portions of the substrate correspond to the at least one structure and the developed photoresist has sloped sidewalls surrounding the exposed portions of the substrate. The first and second bands together operate to control the slope of the sidewalls.

BRIEF DESCRIPTION OF THE DRAWINGS

Aspects and features of embodiments of the invention will become more fully apparent from the following detailed description, the appended claims, and the accompanying drawings in which like reference numerals identify similar or identical elements. The figures are not to scale.

DETAILED DESCRIPTION

Embodiments of the present invention include a reticle having a plurality of contrasting features, referred to herein as interleaved transparent and opaque bands, that at least partially surround a structure, such as a via opening, resulting in the patterned photoresist having controlled sloped or tapered sidewalls with consistent reproducibility. The slope in the photoresist may then be transferred to the underlying layer, such as dielectric (polyimide, oxide, nitride, etc.) or conductive (metal, polysilicon, etc.) layer, during an etch using the tapered photoresist as a mask. Alternatively, the sloped photoresist sidewall angle may be negative (undercutting) and used in a metal lift-off process for patterning metal conductors. The bands surrounding the structure are below the resolution limit of the stepper used to expose the resist so that they are not reproduced in the photoresist but still control the photoresist sidewall slope angle.

Figure 1:
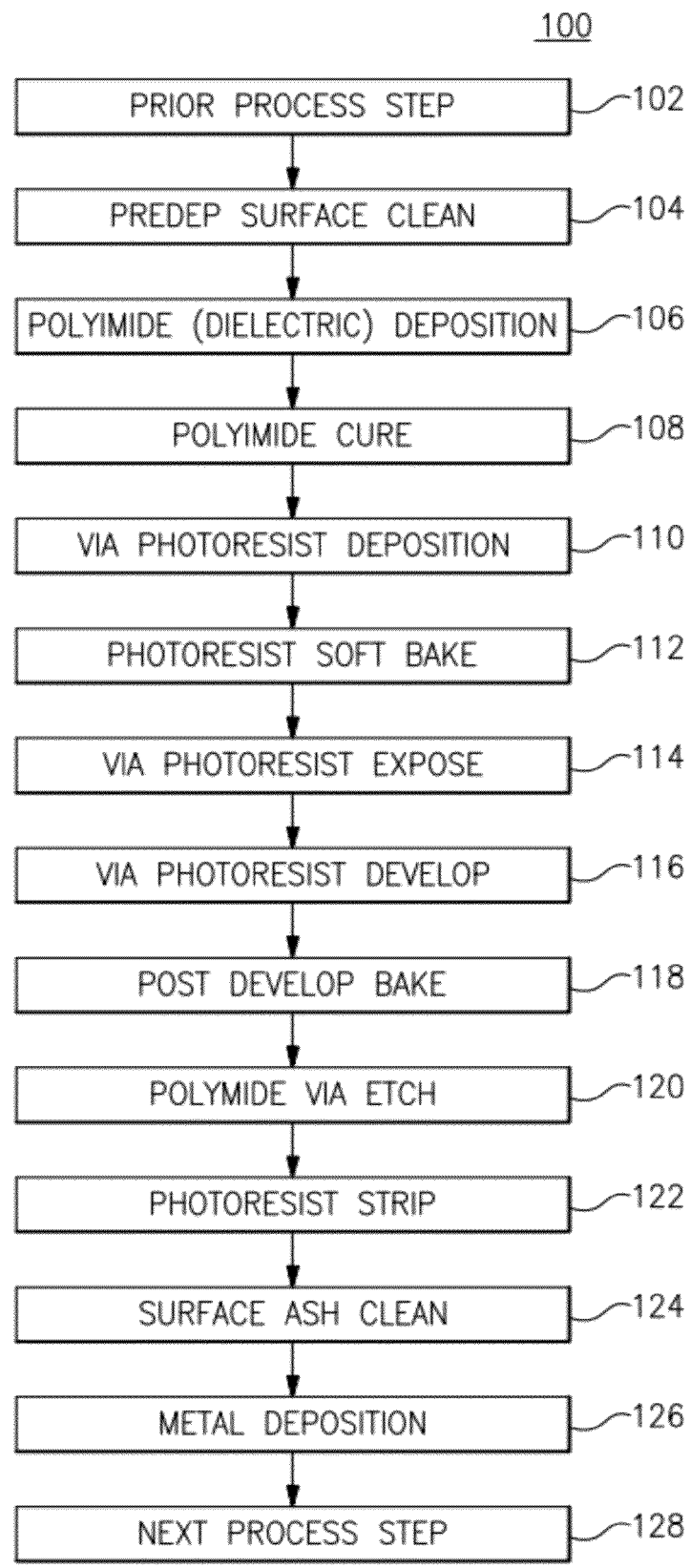
FIG. 1 illustrates a subset of process steps in an exemplary integrated circuit manufacturing process flow.
Figure 2A:
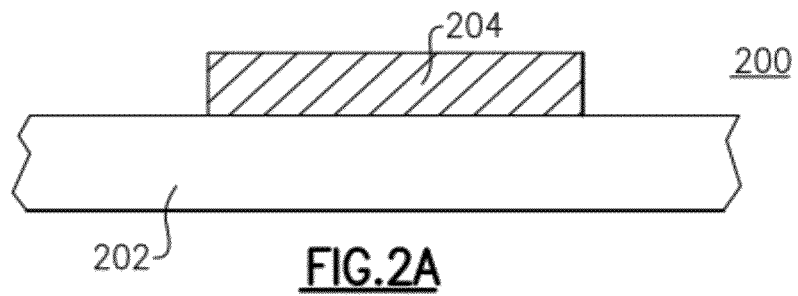
FIGS. 2a-2e are cross-section views of an exemplary integrated circuit corresponding to some of the steps in FIG. 1.

FIG. 1 illustrates a subset 100 of exemplary process steps used, in accordance with one embodiment of the invention, to manufacture an integrated circuit or the like. Beginning with step 102, an exemplary wafer 200, such as that shown in FIG. 2a as partially completed, has a substrate 202 and a metal layer 204 thereon. Not illustrated are diffusions and other conductive (e.g., metal) and dielectric layers on the substrate 202 and under the metal layer 204, as are well known in the art.

Next, step 104 is performed such that the exposed surface of the substrate 202 and metal layer 204 (FIG. 2a) are cleaned using an organic solvent rinse followed by deionized water (DI) rinse or a dry (oxygen plasma) etch followed by a DI rinse, as is well known in the art.

Figure 2B:
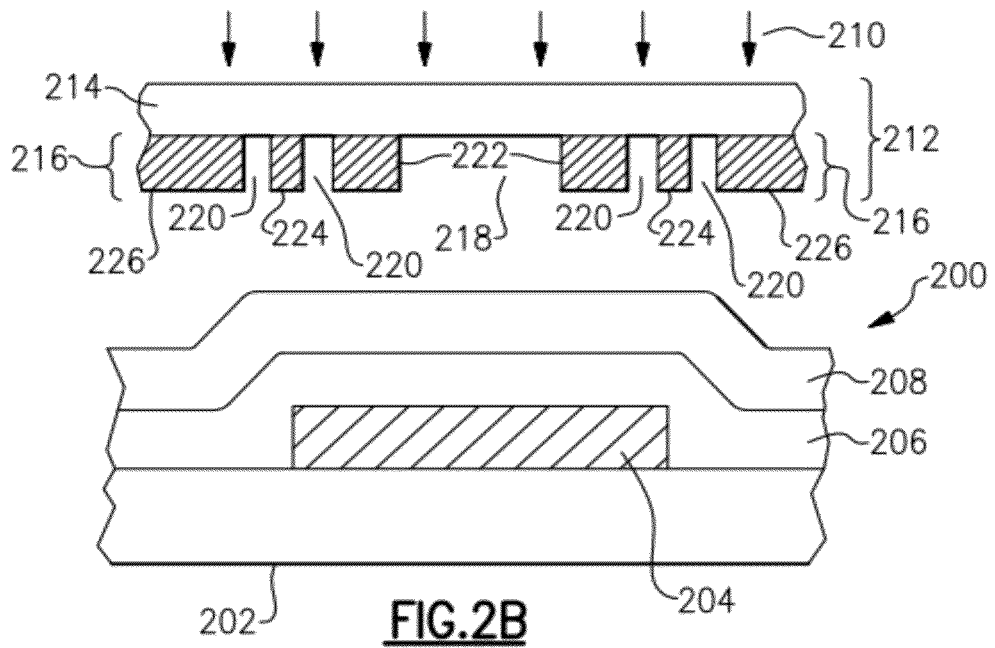

In step 106, a layer of dielectric material 206, such as an oxide, nitride, or an organic material such as polyimide as used in this exemplary embodiment, is deposited over the cleaned substrate 202 and metal layer 204, resulting in the structure as shown in FIG. 2b. The polyimide dielectric is cured in step 108, as is known in the art, to harden the dielectric and enhance adhesion of the dielectric to the underlying layers, e.g., 202 and 204. Next, a layer of photoresist 208 is deposited over the polyimide layer 206 in step 110, and the photoresist is baked in step 112 to partially harden the photoresist layer and adhere the photoresist to the dielectric layer 206. As will be explained in more detail below, the photoresist 208 is used to mask selected portions of the dielectric layer 206 when the dielectric layer is etched in step 120.

Once the photoresist layer 208 is ready and as will be explained in more detail below in connection with FIG. 3, in step 114 the photoresist 208 is exposed using a highly collimated monochromatic UV light source, illustrated by the arrows 210, though a reticle 212 composed of a substrate 214 that is, for purposes here, essentially 100% transmissive (transparent) and regions 216 having essentially no transmissivity (opaque). The substrate 214 is typically a clear quartz plate with chromium opaque regions 216 patterned in accordance with data in the well-known Graphic Data System (GDS) data format, supplied by the designer of the integrated circuit, by a variety of well-known techniques used to design and fabricate a reticle. The exposing of the photoresist 208 through the reticle 212 results in a transfer of a portion of the pattern of the opaque and transparent regions on the reticle 212 into the photoresist 208 as a latent image before the photoresist 208 is developed. As will be explained in more detail below, the pattern of transparent regions 220 and opaque regions 224, 226 are not transferred to the developed photoresist but help provide a positively-sloped sidewall in the photoresist after photoresist develop as described below. The transparent region 218 defines a structure, such as a via, to be formed in the dielectric layer 206. Here, the transparent region 218 is surrounded by the opaque regions 222 to define or delineate the transparent region 218.

Figure 3:
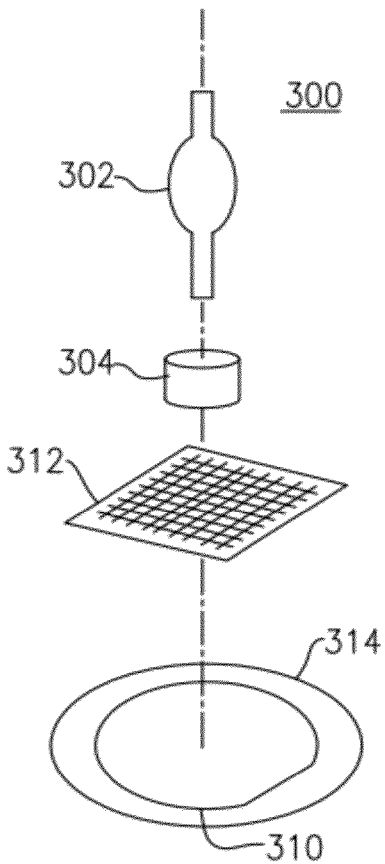
FIG. 3 is a simplified diagram of a exemplary stepper used to expose photoresist using a reticle.

Turning temporarily to FIG. 3, a simplified i-line (365 nm light) exemplary stepper 300 is illustrated, such as the type used to expose the photoresist 208 in FIG. 2b. Here, light from a source of UV light, such as a mercury arc lamp 302, is filtered and focused by filter and lens assembly 304 to provide highly collimated monochromatic UV light that passes though a reticle 312, such as the reticle 212 shown in FIG. 2b. Shadowed light from the reticle 312 impinges on the photoresist layer (not shown) on wafer 310 on a chuck 314 so that the image on the reticle 312 to be transferred or printed to the photoresist forms a latent image (not shown) therein. Some steppers utilize a lens assembly (not shown) to transfer or print a smaller image in the photoresist than on the reticle, sometimes referred to as "reduction printing". When a reducing lens assembly is used, the chuck 314 is moved or stepped so that the image on the reticle 312 is replicated at various sites across the wafer 310. Where no reducing lens assembly is used, an approximately one-to-one image transfer occurs, sometimes referred to as "proximity printing". Proximity printing is the image transfer technique illustrated in FIG. 2b but it is understood that a reducing lens assembly may be interposed between the reticle 212 and the photoresist layer 208.

While the stepper 300 is described above as an i-line (365 nm light) stepper, the stepper 300 may also be used for other wavelengths, such as g-line (436 nm light) or deep-UV (e.g., 193 nm) lithography.

Figure 2C:
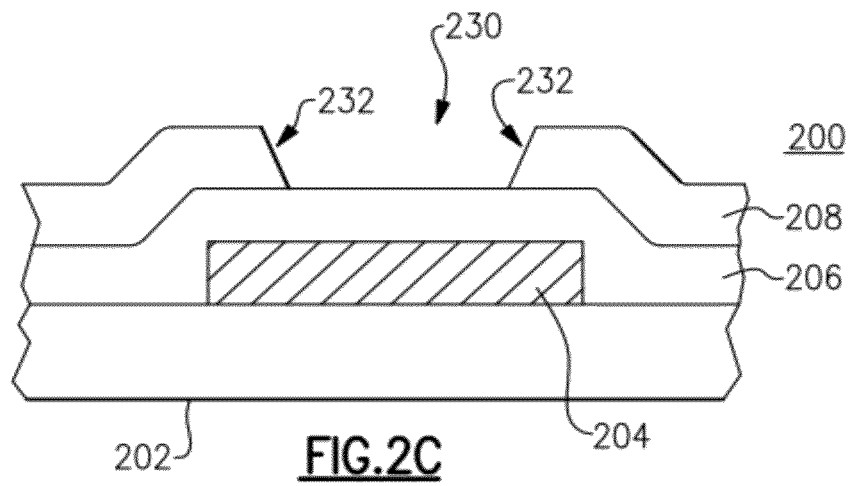

Returning to FIG. 1, in step 116 the latent image (not shown) in the exposed photoresist 208 (FIG. 2b) is developed using conventional techniques and the portions of the photoresist that are exposed to the light are removed, leaving behind unexposed photoresist that was not exposed to the light 210 due to the shadowing of the light 210 by the opaque regions 216. However, as will be explained in more detail below, the opaque regions 222 and 224 are not printed in the exposed photoresist 208 but the larger opaque regions 226 are printed in the developed photoresist 208. Thus, the developed photoresist 208 is patterned in accordance with the image on the reticle 212. As shown in FIG. 2c, the developed photoresist 208 is shown with an opening 230 corresponding to the space 218 between opaque regions 226 shown in FIG. 2b.

The resist used in this exemplary embodiment is a positive resist (bonds in the photoresist are broken when exposed to light, allowing the exposed areas to be easily removed during resist develop). In another embodiment and described in more detail in connection with FIGS. 12-14, a negative resist (bonds in the photoresist are formed when exposed to light, making the exposed areas more difficult to be removed than non-exposed areas) can be used as the photoresist 208 with the reticle 212 as shown.

Figure 4A:
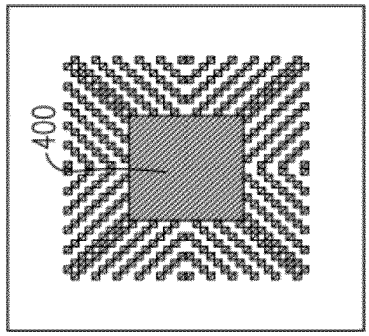
FIGS. 4a-4e illustrates different experimental reticle designs.
Figure 4B:
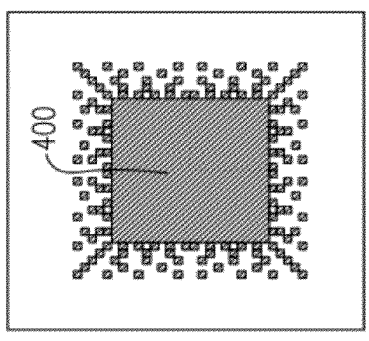
Figure 4E:
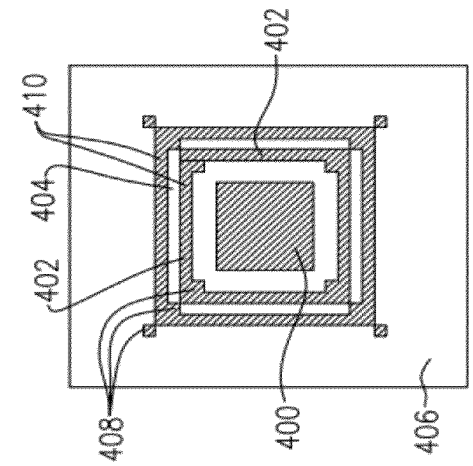
Figure 4D:
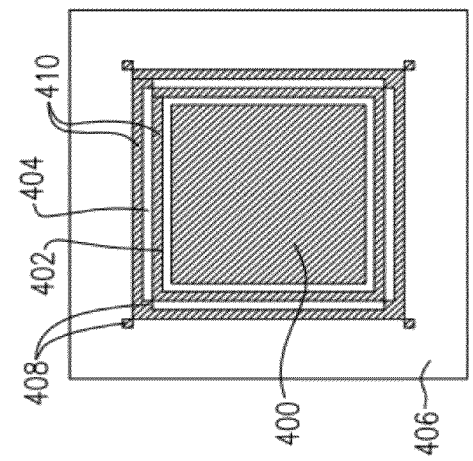
Figure 4C:
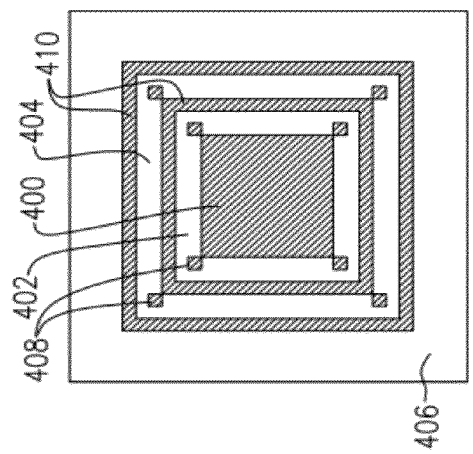

In a series of experiments, features such as regions 222, 224 and openings 220 were added around opening 218 to create sloped resist profiles 232 such as that shown in FIG. 2c. The experiments were performed using three different kinds features surrounding a square structure (corresponding to opening 218 in FIG. 2b) such as that used to form a via in the dielectric layer 206, were tried on reticles used to pattern exposed photoresist on a substrate as shown in FIGS. 4a-4e. The three kinds of features are: a) radial lines formed from minimum-sized squares extending radially from the structure (referred to herein as "radial lines") shown in FIG. 4a, b) an array of minimum-sized squares adjacent to the structure and having a density that decreases with increasing distance from the structure (referred to herein as a "grid array") as shown in FIG. 4b, and c) three sets of interleaved, non-overlapping rectangular bands or "rings" of different widths that surround the structure (referred to herein as "concentric bands" but need not be concentric with the structure and may be rectangular, circular, polygonal, etc., as described in more detail below) as shown in FIGS. 4c-4e. A first test reticle was made with the different reticle feature designs added around a test via opening 400 as shown in FIG. 4a-4c. In this example, shaded regions correspond to opaque regions 222, 224, 226 on the reticle 212 (FIG. 2b), and unshaded areas correspond to clear areas 218, 220. Each of these feature designs were placed around seven sizes square via sizes (0.6, 0.9, 1.2, 1.5, 2.1, 3.0 and 3.6 microns), using two minimum feature or grid sizes of 0.1 and 0.15 um squares for a total of 42 different test structures. For purposes here, the minimum feature size is the smallest structure that can be formed on the reticle, a limitation of the tool used to manufacture the reticle. Generally, a feature having the minimum feature size is below the resolution limit of the stepper and, thus, is too small to be formed ("print") in the photoresist exposed using the reticle. Consequently, for each design tested, the sizes of the various features were too small to print in the exposed and developed photoresist. On the concentric band design, the corners were weighted with serifs to maintain the square shape of the via after photoresist develop. A second test reticle was used to evaluate the spacing and pitch of various concentric bands around each via as shown in FIGS. 4c-4e. A subset of the resulting via structures from all the experiments can be seen in FIGS. 5a-5h. All of these vias were formed using a 4.0 micron thick i-line resist (NPR8000 available from Nagase & Co. Ltd, Tokyo, Japan) on an i-line stepper with a lens resolution of 0.5 um and no defocus (0 microns).

The reticle structures used to create the test vias shown in FIGS. 5a-5h have the following characteristics:

TABLE 1

| Figure | Feature Size | Reticle Feature | Reticle Resolution | Wall Angle |
|---|---|---|---|---|
| 5a | 1.6 micron | Radial Lines (FIG. 4a) | 0.15 micron | 89.2° |
| 5b | 1.6 micron | Grid Array (FIG. 4b) | 0.15 micron | 89.6° |
| 5c | 0.9 micron | Concentric Band, Double/Double (FIG. 4c) | 0.15 micron | 82.5° |
| 5d | 1.5 micron | Concentric Band, Double/Double (FIG. 4c) | 0.15 micron | 84.0° |
| 5e | 2.1 micron | Concentric Band, Double/Double (FIG. 4c) | 0.15 micron | 83.3° |
| 5f | 3.0 micron | Concentric Band, Single/Single (FIG. 4d) | 0.15 micron | 88.9° |
| 5g | 3.6 micron | Concentric Band, Single/Single (FIG. 4d) | 0.15 micron | 89.0° |
| 5h | 1.2 micron | Concentric Band, Double/Single (FIG. 4e) | 0.15 micron | 85.8° |

As will be explained in more detail below, the terms "double/double", "single/single", and "double/single" refer to the thickness of the innermost opaque band 402 and the outermost opaque band 404 in FIGS. 4c-4e, respectively, measured in increments of the reticle grid sizing (here, 0.15 microns). Spacing between the opaque bands from each other and from the via structure 400 is approximately the reticle grid sizing (0.15 micron). Thus, for purposes of this experiment, "double" refers to a 0.30 um wide chrome (opaque) band surrounded by a 0.15 um wide transparent band, and "single" refers to a 0.15 um opaque band with a 0.15 um wide transparent band. Serifs 408 are added to the corners of bands 412 and 404 in FIG. 4c to assist in retaining the shape of the via structure 400 in the developed photoresist. Alternatively, the serifs 408 are not added to the innermost band 402 in FIG. 4d and serifs may be added to regions 406 proximate to outermost one of the transparent bands 410 as shown in FIGS. 4d and 4e. For comparison, the inner band 402 and outer band 404 corresponds to opaque regions 222 and 224, respectively, of FIG. 2b. Similarly, region 406 in FIGS. 4c-4e corresponds to opaque regions 226 in FIG. 2b and transparent bands 410 correspond to openings 220. It is understood that while in FIGS. 4c-4e only two opaque bands 402, 404 and two transparent bands 410 are shown, it understood that more than two of each of the opaque and transparent bands may be used as desired.

As used herein, sidewall (or wall) slope angle is the inner angle of the sidewall with respect to the substrate. For example, a 90° sidewall slope angle is perpendicular to the substrate and is considered to have no slope. In this embodiment, the slope is considered to be a positive, i.e., the photoresist opening is wider at the top of the opening than at the bottom. In an alternative embodiment discussed below, the slope is negative, i.e., the photoresist opening is wider at the bottom of the opening than at the top, also known as an undercut of the resist.

Figure 5A:
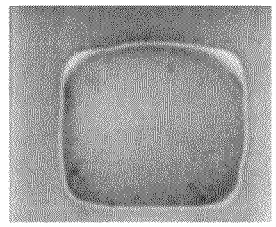
FIGS. 5a-5h illustrates the results of using the experimental reticle designs of FIG. 4a-4e.
Figure 5B:
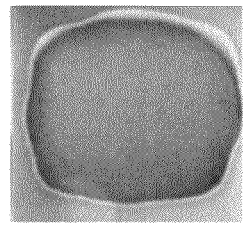

As shown in FIGS. 5a and 5b and as listed in the above table, no significant slope was created in the photoresist sidewall profile when using the radial lines and grid array features, respectively, around the via structure regardless of the size of the via structure.

Figure 5C:
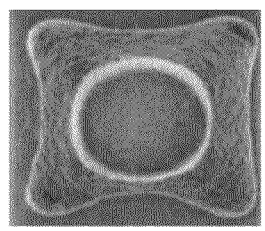
Figure 5D:
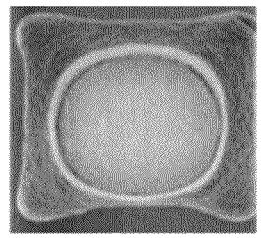
Figure 5E:
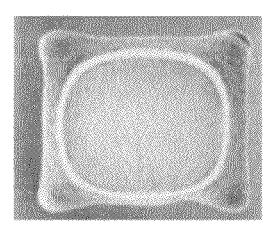

When compared to the vias in FIGS. 5a and 5b, the vias in FIGS. 5c-5e formed with reticle via structures having the concentric band patterns and a resolution of 0.15 um have a significantly sloped sidewall profile. Although not shown here, the photoresist sidewall profile produced using 0.1 micron minimum feature size (e.g., the double-width band is 0.2 microns wide, the single band is 0.1 microns wide, and the spacing between the bands is 0.1 microns) is not as pronounced in comparison to the results using the 0.15 micron minimum feature size, the resulting sidewall profile slope angle was greater than the sidewall angle created using the grid array or radial line features. It is believed that smaller and larger reticle grid sizes will also result in a significantly sloped sidewall profile.

Figure 6:
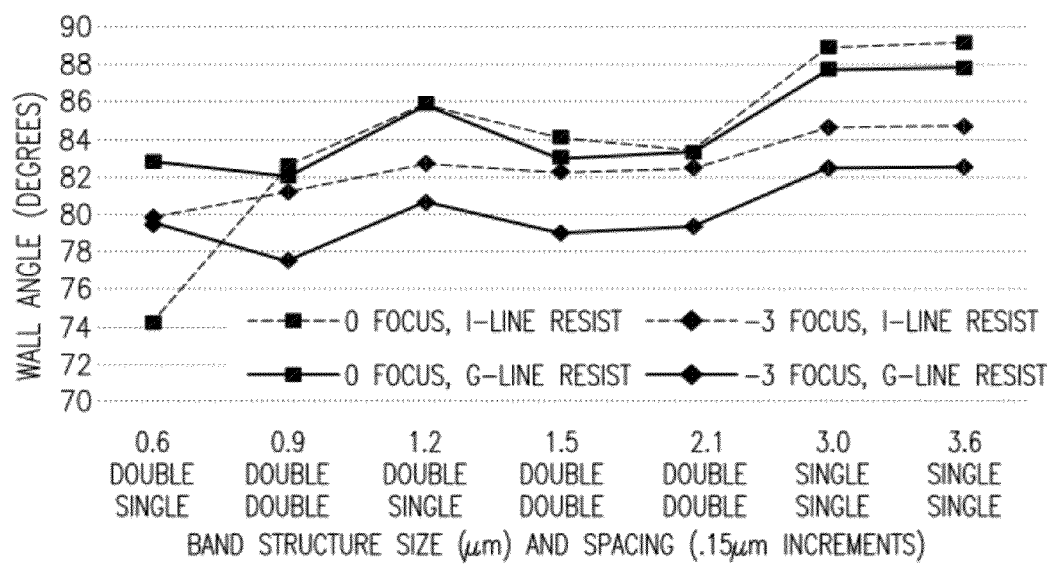
FIG. 6 is a plot of sidewall angle results for various concentric band spacings, via sizes, and resist types at two focus settings.

Using additional test reticles, a g-line resist (e.g., 4 micron thick layer of STR-1045 available from Rohm and Haas) and an i-line resist (e.g., 4.0 micron thick layer of the above-identified NPR8000 resist) was used at two focus settings, 0 and −3. As shown in FIG. 6 and for all the design iterations discussed above, the lowest sidewall angle was achieved with the double/double concentric band designs regardless of resist type. This corresponds to the reticle structures with the 0.9, 1.5 and 2.1 micron (um) via sizes.

Figure 5F:
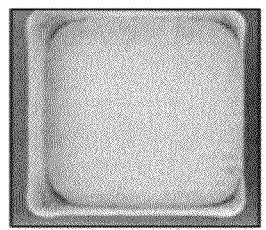
Figure 5G:
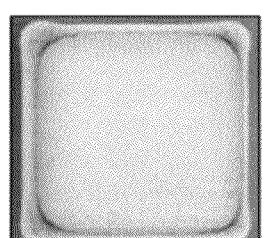
Figure 5H:
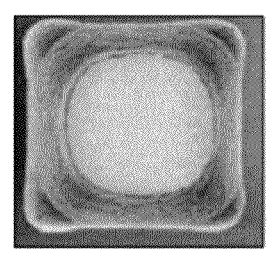

The 3.0 and 3.6 um vias with the single/single band spacing in FIGS. 5f and 5g show little variation with exposure energy but generate a sidewall angle not much better than a control group having no features surrounding the structure on the reticle.

To optimize a stepper process, a focus-expose matrix is typically used to plot critical line-width data. The resulting graph, or Bossung curve, plots the line-width as a function of focus and exposure. The optimum process window may be defined as the region where a curve is the flattest (changes the least) over the largest focus range and exposure range. In this instance, this type of graph was not useful because of the desire to optimize the sizes of the resist openings at both the top and bottom of the developed resist at the same time.

Figure 7A:
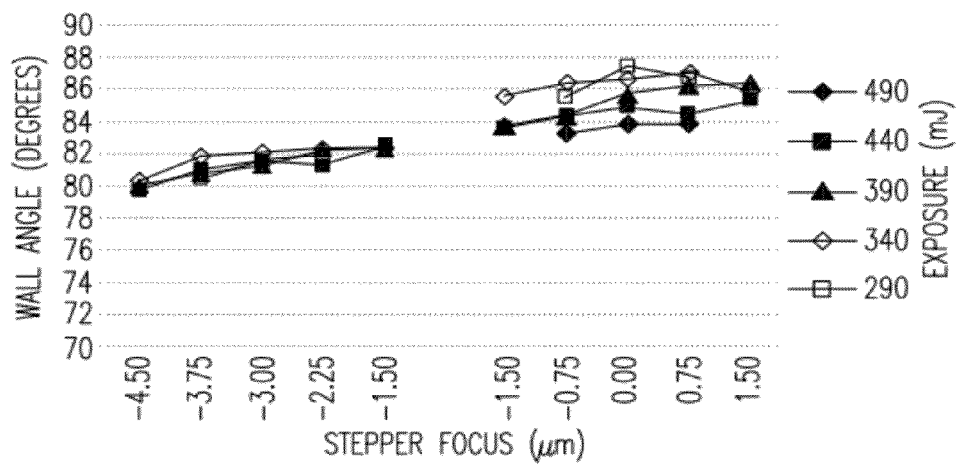
FIGS. 7a-7c are plots of sidewall-angle Bossung curves for double/single concentric band designs, double/double band designs, and a control group with no reticle features added.
Figure 7B:
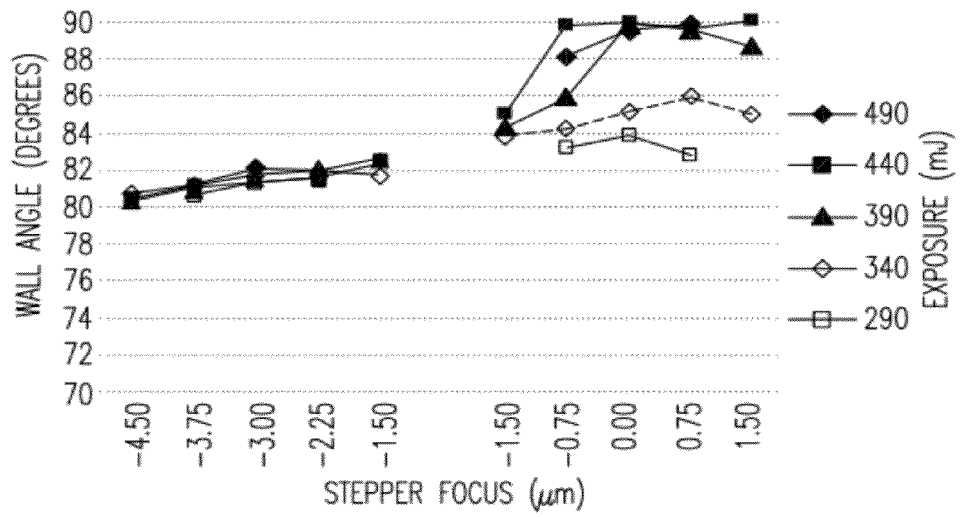
Figure 7C:
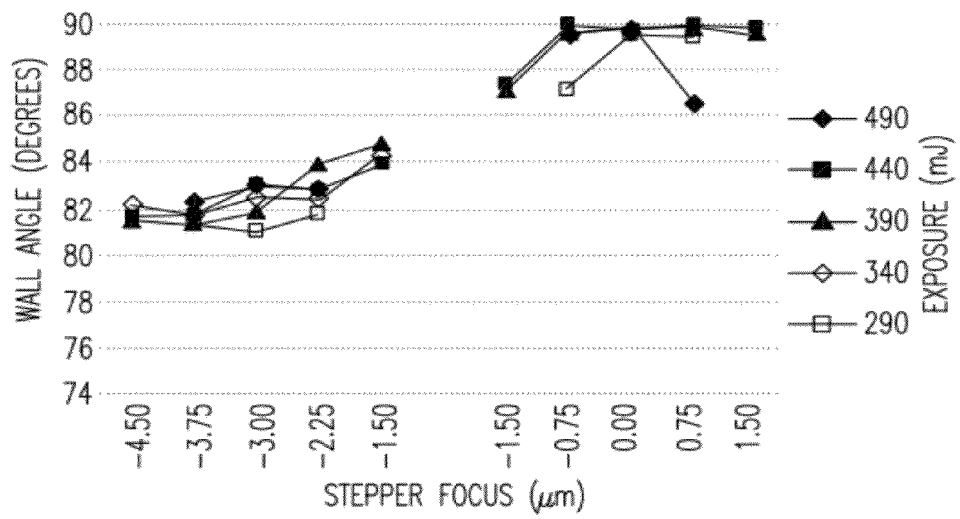

In FIGS. 7a-7c, a different type of Bossung curve is plotted for the two via designs (1.2 micron square via opening with double/single-spaced concentric bands in FIG. 7a; 1.5 square micron opening with double/double-spaced concentric bands in FIG. 7b; and a control group of a 2 micron square via opening with no concentric bands in FIG. 7c). These curves are sidewall-angle Bossung curves that combine both the top and bottom resist measurements into the resist sidewall angle calculation, using an assumption of a straight or linear sidewall slope. This data was collected using two wafers coated with 4 micron thick i-line resist, exposed sequentially with overlapping focus-expose matrices on the same stepper, and developed together on the same develop track. The gap between the data at −1.5 um focus suggests that wafer-to-wafer variation and edge field focus variation may be responsible for a 1 to 2 degree sidewall angle variation between wafers.

In the first two the sidewall-angle Bossung curves shown in FIGS. 7a and 7b, the flattest region and optimum depth of focus for sidewall angle control was in the vicinity of −3 um focus. Some sites exposed at +1.5 um focus could not be measured due to vias not completely opening after etching.

These Bossung curves show that for the control group (FIG. 7c; no concentric bands are used), the variation in sidewall angle increases for lower focus settings during exposure. However, using the concentric band reticle design, it is possible to reduce this variation of sidewall angle to achieve a sloped photoresist sidewall profile at a lower focus. As illustrated in FIG. 7a, the 1.2 um via with the double/single band design shows the best of both conditions: a sloped sidewall profile with a good depth of focus across multiple exposure settings, and a relatively linear (predictable) change in sidewall angle with increasing focus for various exposure settings.

Resist thickness is believed to have relatively little impact on the photoresist sidewall slope angle. It is believed that between 1.5 micron and 8 micron thick resist is usable in accordance with the disclosed embodiment for at least i-line applications.

Figures 8A, 8B:
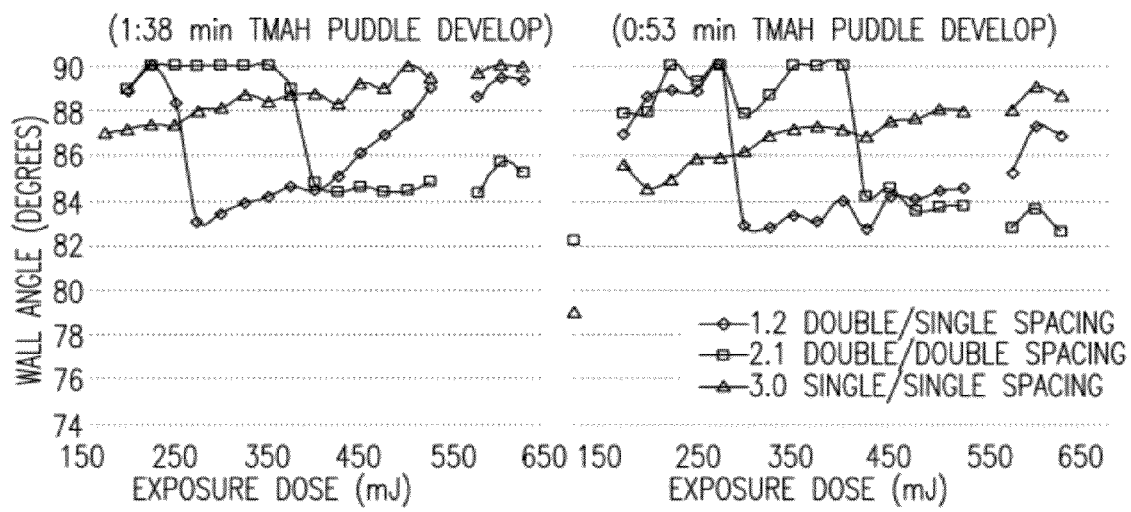
FIGS. 8a and 8b are plots of impact of exposure on via sidewall angle for two different resist develop times.

Additional factors discovered that effects sidewall angles are exposure energy (dose) and develop time on structures with the concentric band features. In FIGS. 8a and 8b, three concentric band designs are evaluated using two different develop times after wafer exposure in an i-line resist at an exposure wavelength of 365+/−2 nm. As illustrated in FIG. 8a, a 1.2 um via with the double/single concentric band design does not affect the photoresist sidewall angle until the energy is above a threshold of 300 mJ when the resist is developed for 0:53 minutes or an energy above 275 mJ for a 1:38 minute develop time. Similarly, as illustrated in FIG. 8b, a 2.1 um via with a double/double concentric band structure did not result in a sloped resist sidewall until the exposure crosses a threshold energy above 425 mJ for the 0:53 minute develop time and above 400 mJ for a 1:38 minute develop time. When the developed photoresist was viewed in a scanning electron microscope, it was apparent that the concentric bands did not affect the developed resist sufficiently or uniformly enough to change the sidewall angle around the via opening in the photoresist unless the exposure exceeded the threshold energy. At exposure energies between the minimum dose (i.e., the dose required to expose the resist sufficiently so that the developer can remove the resist in the exposed area, also referred to as "clearing the resist") but below the threshold energy, photoresist via profiles on the wafer appeared nearly vertical. It is desirable that the exposure energy should be greater than the threshold energy so that, it is believed, sufficient light will expose the band structures and result in developed photoresist sidewalls with sloped sides. No turn-on energy effect is evident in the data for single/single design structures, possibly indicating the single/single concentric band design is not as efficient in transmitting sufficient light to generate the sloped resist sidewall profile as the double/double or double/single embodiments.

For both develop times, the double/single design has a lower turn-on energy than the double/double design which suggests the user has a larger process window in which to simultaneously target the critical dimension of the bottom of the via opening in the photoresist as well as the sidewall angle. However, the longer develop time (FIG. 8a) has a somewhat lower threshold energy than the shorter develop time (FIG. 8b).

The difference in the change in sidewall angle with develop time indicates that the sidewall angle process window is larger with a short develop time as long as the develop time is long enough to fully open the via opening in the photoresist.

Returning to FIG. 1, in step 118 the developed photoresist 208 having sloped sidewalls 232 in FIG. 2c is baked in an inert atmosphere to harden the photoresist. The temperature and time needed to bake the photoresist to a desired hardness is dependent on the type of photoresist used and is specified by the photoresist manufacturer. The bake temperature is selected to be below the point at which the resist begins a significant change in its shape or flow. This is used to avoid the hardening step from causing any significant variation to the slope created by the exposure process in step 114 discussed above.

Figure 2D:
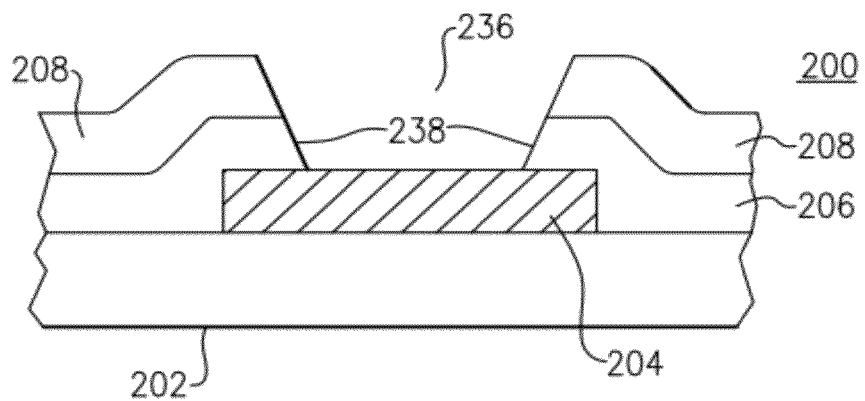

Next, in step 120, the baked photoresist 208 is used as a mask to dielectric layer 206 during etching of the dielectric as shown in FIG. 2d. The dielectric layer 206 in this example is a layer of polyimide that is etched with a conventional anisotropic dry (plasma) etch as is well known in the art. The anisotropic etch transfers the slope of the sidewalls 232 to the dielectric layer 206 to form an opening 236 with sloped sidewalls 238 in the dielectric layer. While not wanting to be held to any specific theory, it is believed that the slope of sidewall 232 is transferred to the dielectric layer 236 by the sloped resist sidewall eroding away during etching to expose an increasing amount area of the dielectric layer underlying the photoresist as the etch progresses. Because the dielectric etch preferentially etches the dielectric layer instead of the photoresist 208 and the underlying metal layer 204, the etch process continues for a period after the etched portion of the dielectric layer 206 is opened to expose the underlying metal layer 204 to assure that the opening 236 is free of the dielectric material.

Next, in step 122 the baked photoresist 208 is removed by a conventional chemical strip that dissolves the hardened photoresist. A DI wash may follow the resist strip step 122 to remove residual contaminants on the wafer 200. Next, in step 124 any remaining photoresist and other organic contaminants are "ashed" using an oxygen plasma atmosphere to oxidize and remove any remaining organic compounds on the wafer 200.

Figure 2E:
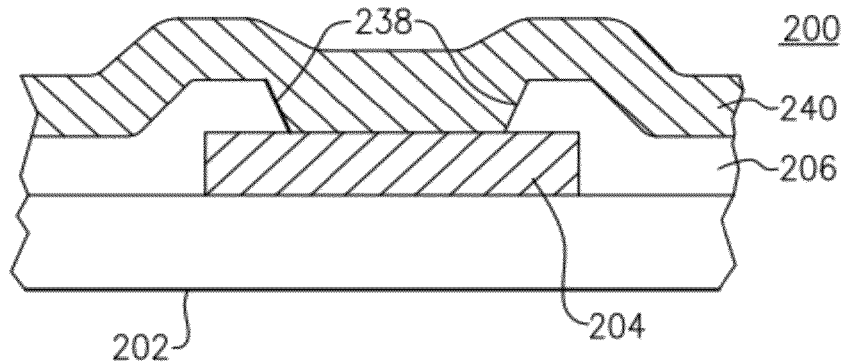

In step 126 a metal layer 240, such as aluminum or a gold alloy, is sputtered onto the wafer 200 as shown in FIG. 2e. As indicated in step 128, further processing steps may be performed on the wafer 200, such as patterning the deposited metal layer 240 using a patterned photoresist (not shown) over the metal layer 240 and then removing the exposed metal through conventional anisotropic etching. In an alternative embodiment, a conventional lift-off process is used to pattern the metal layer 240. In this embodiment and as will be explained in more detail below, a photoresist layer (not shown) is patterned with a method similar to how photoresist layer 208 is patterned as described above (to create negatively-sloped resist profiles) or by conventional resist patterning processes to form resist profiles with negative or no slope, then the metal layer 240 is deposited (usually by sputtering a gold alloy metal) onto the patterned photoresist. The metal deposited on the top of the photoresist is then removed or "lifted" from the wafer 200 as the resist under the deposited metal is removed, leaving behind the deposited metal where the underlying layers, e.g., dielectric layer 236 and metal layer 204, were not covered by the patterned photoresist.

Figure 9:
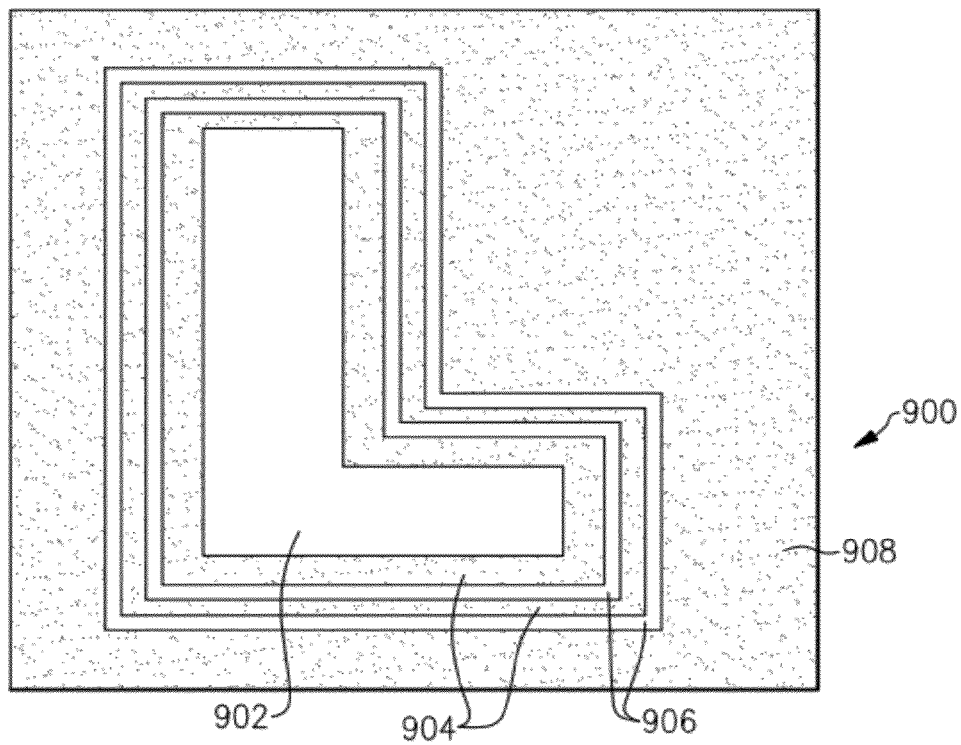
FIGS. 9 and 10 illustrates alternative reticle designs in accordance with alternative embodiments of the invention.
Figure 10:
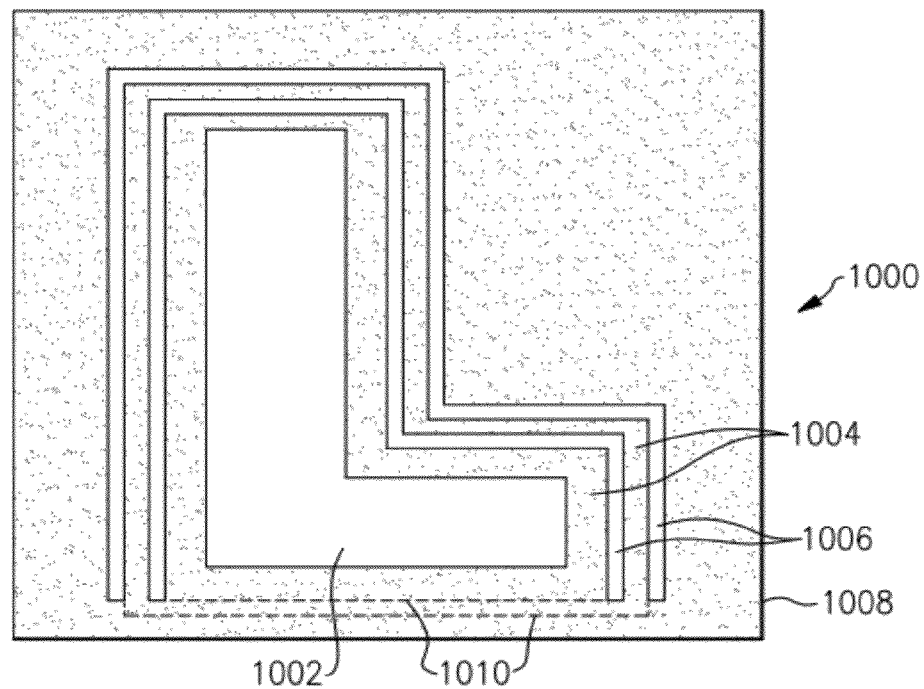

The reticle features of one embodiment of the invention are described above as interleaved opaque and transparent bands that are concentric with the structure, it is understood that the embodiments described herein generally have two or more opaque bands that surround the structure and that are spaced from each other by transparent bands. In these embodiments, an innermost edge of the innermost opaque band borders the structure to define the structure. To prevent the bands from printing in the resist, the widths of the bands and the spacings between the bands are below the resolution limit of the stepper the reticle is used in. More specifically, the widths and the spacings are less than a wavelength of the light used to expose the resist through the reticle. For example and as shown in FIG. 9, a reticle 900 has a polygonal structure 902 that lacks a defined center, the opaque bands 904 surround and border the structure with transparent bands 906 spacing the opaque bands 904 from each other and from opaque area 908 will result in the developed photoresist (not shown but corresponding to resist layer 208 in FIG. 2c) having a sloped sidwall profile. The thicknesses or widths of the bands are also less than the exposure light wavelength. An alternative embodiment is shown in FIG. 10, where a reticle 1000 with a polygonal structure 1002 having opaque bands 1004 surrounding and bordering the structure 1002 with transparent bands 1006 spacing the opaque bands 1004 from each other and from opaque region 1008 for at least part of the of the periphery of the structure 1002. As illustrated by dotted lines 1010, the opaque bands 1004 and the region 1008 are adjoined where the transparent bands 1006 are absent. In this embodiment, the developed photoresist (not shown) in proximity to the transparent bands 1006 will have a sloped sidewall profile. While both transparent bands 1006 are shown as not completely surrounding the structure 1002, it is believed that at least two of the transparent bands 1006 need to be present where a sloped resist profile is desired.

In the embodiments discussed above, the widths of the opaque and transparent bands are substantially uniform, i.e., the width of any one of the opaque or transparent bands is substantially the same for the entire length of the band. However, in an alternative embodiment, it may be desirable for a given band to have non-uniform width. Further, all of the transparent bands are described as the same widths but, in still another alternative embodiment, it may be desirable that one or more of the transparent bands have a width different from another one of transparent bands. Having the opaque and transparent bands with varying and different widths may be used to create different reist slope profile angles around different parts of a structure.

Figure 12:
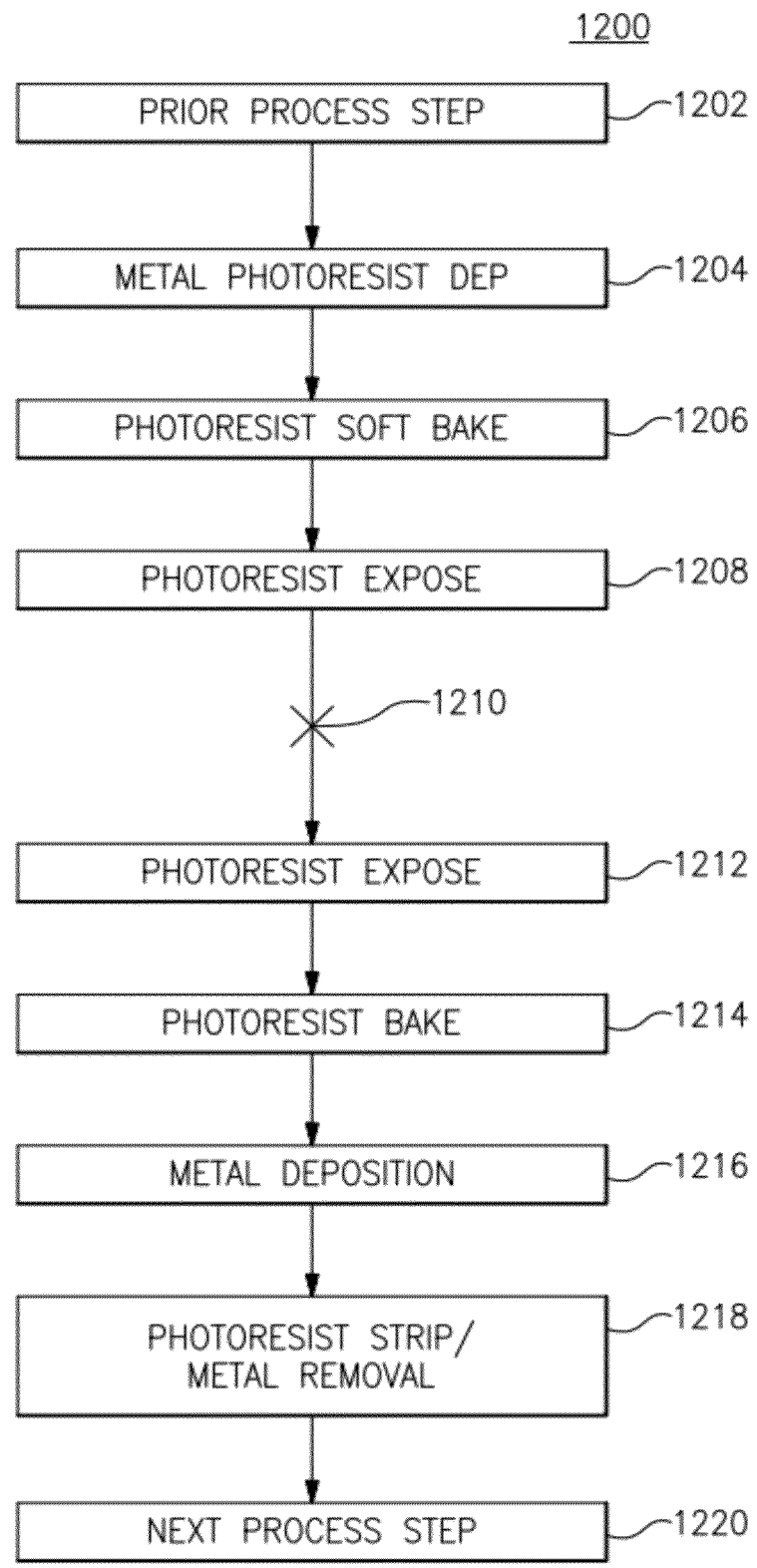
FIG. 12 illustrates a subset of metal lift-off process steps in an exemplary integrated circuit manufacturing process flow.
Figure 13A:
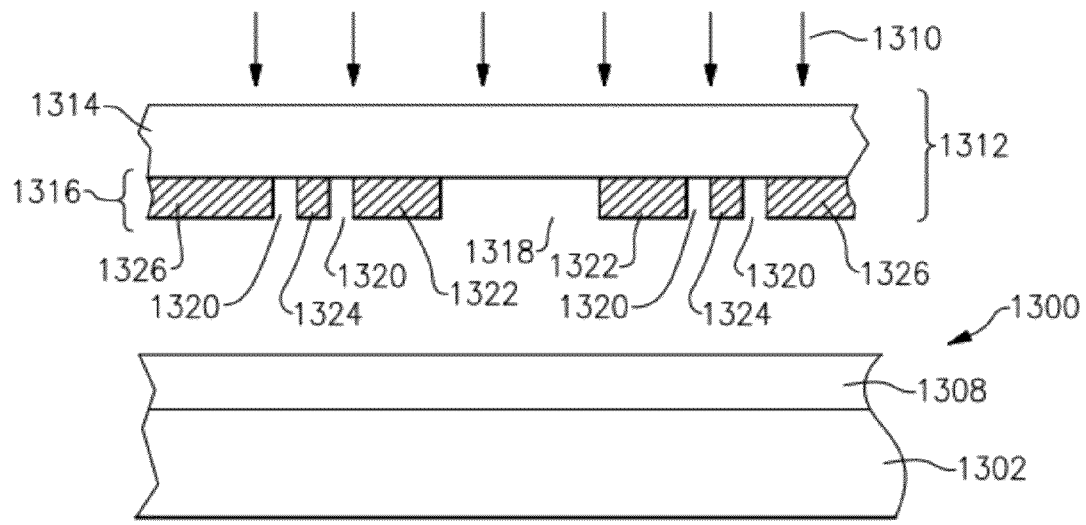
FIGS. 13a-13c are cross-section views of an exemplary integrated circuit corresponding to some of the steps in FIG. 12.

As mentioned above and in still another embodiment of the invention, a mask using the above-described opaque and transparent bands can be used in conjunction with a metal lift-off process to define a metal layer. FIG. 12 illustrates a subset 1200 of exemplary process steps used to perform a metal lift-off process as part of the manufacture of an integrated circuit or the like. Beginning with step 1202, an exemplary wafer 1300, such as that shown in FIG. 13*a*, is partially completed and includes a substrate 1302. Not illustrated are diffusions and other conductive (e.g., metal) and dielectric layers on the substrate 1302, as are well known in the art.

Next, in step 1204 a layer of photoresist 1308 is deposited on the wafer 1300, the photoresist used to define a metal layer deposited at a later step and described in more detail below. In step 1206, the photoresist 1308 is baked to partially harden the photoresist layer and adhere the photoresist to the substrate 1308. Once the photoresist layer 1308 is ready and as described in detail above in connection with FIG. 3, in step 1208 the photoresist 1308 is exposed using a highly collimated monochromatic UV light source, illustrated by the arrows 1310, though a reticle 1312 composed of a substrate 1314 that is for purposes here essentially 100% transmissive (transparent) and regions 1316 having essentially no transmissivity (opaque). The substrate 1314 is typically a clear quartz plate with chromium opaque regions 1316 patterned in accordance with data in the well-known Graphic Data System (GDS) data format, as described above. The exposure of the photoresist 1308 through the reticle 1312 results in a transfer of a portion of the pattern of the opaque regions and transparent regions on the reticle 1312 into the photoresist 1308 as a latent image (not shown) before the photoresist 1308 is developed in a later step. As was explained above in connection with FIG. 2*b*, the pattern of opaque regions 1322, 1324, 1326 and transparent regions 1318, 1320 are not transferred to the developed photoresist but help provide a negatively-sloped sidewall in the photoresist after development as described below. The transparent region 1318 defines a structure, such as a metal conductor, to be formed on the substrate 1300. Here, the transparent region 1318 is surrounded by the opaque regions 1322 to define or delineate the transparent regions 1318.

Figure 13B:
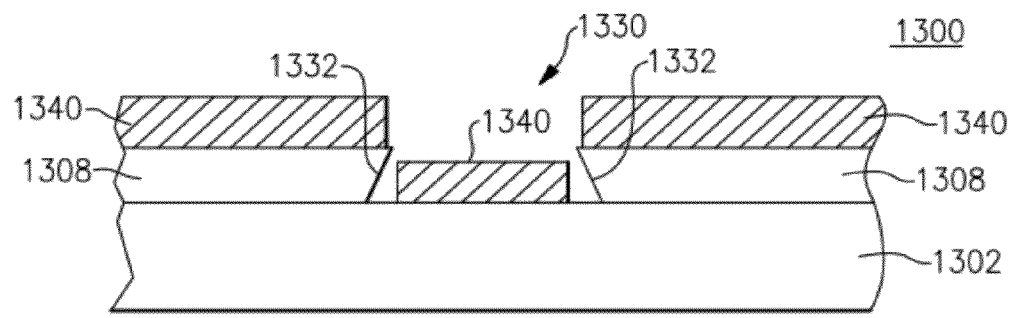
Figure 14:
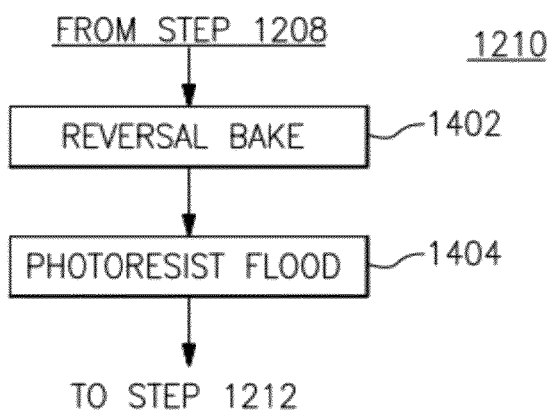
FIG. 14 illustrates additional process steps for the metal lift-off process steps in FIG. 12.

If the photoresist 1308 on substrate 1302 is a negative photoresist, then step 1212 is performed next. If, in an alternative embodiment, the photoresist is a positive resist, additional steps 1210 described below in connection with FIG. 14 are inserted between steps 1208 and 1212. For purposes of this description, a negative photoresist is used and the steps in FIG. 14 are not performed. Then in step 1212, the latent image in the exposed photoresist 1308 is developed using conventional techniques and the portions of the negative photoresist that are not exposed to the light are removed, leaving behind exposed photoresist that was exposed to the light 1310 due to the shadowing of the light 1310 by the opaque regions 1316. As explained above in connection with FIGS. 2*a*-2*f*, the opaque regions 1322 and 1324 are not printed in the exposed photoresist 1308 but the larger opaque regions 1326 are printed in the developed photoresist 1308. Thus, the developed photoresist 1308 is patterned in accordance with the image on the reticle 1312. As shown in FIG. 13*b*, the developed photoresist 1308 is shown with an opening 1330 corresponding to the transparent region 1318 between opaque regions 1326 shown in FIG. 13*a*.

The negatively-sloped resist sidewalls 1332 on either side of opening 1330 in FIG. 13*b* is a result of using opaque and transparent bands surrounding the transparent structure 1318 in FIG. 13*a* as described above. In this embodiment, the bands on mask 1312 correspond to the bands on mask 212 of FIG. 2*b*. For example, the transparent structures 1318 and 1320 corresponds to transparent structures 218 and 220, respectively, and the opaque structures 1322, 1324, and 1326 correspond to opaque regions 222, 224, and 226, respectively. The operation of the interleaved opaque and transparent bands in both embodiments operates to produce sloped photoresist sidewalls, one with positive slope as shown in FIG. 2*c*, the other with negative slope as shown in FIG. 13*b*.

Returning to FIG. 12, in step 1214 the developed photoresist 1308 having sloped sidewalls 1332 shown in FIG. 13*b* is baked in an inert atmosphere to harden the photoresist. The temperature and time needed to bake the photoresist to a desired hardness is dependent on the type of photoresist used and is specified by the photoresist manufacturer. The bake temperature is selected to be below the point at which the resist begins a significant change in its shape or flow. This is used to avoid the hardening step from causing any significant variation to the slope created by the exposure process in step 1208 discussed above.

Next, in step 1216, a layer of metal 1340, such as a gold alloy, is deposited, such as by sputtering or evaporation, onto the wafer 1300 as shown in FIG. 13*b*. Portions of the metal layer 1340 on the top of the photoresist 1308 will be removed in a later step, leaving behind the portions of the metal layer 1340 on the substrate 1302 in opening 1330.

Figure 13C:
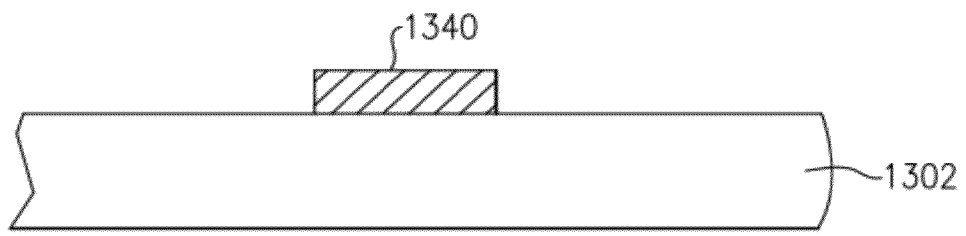

Next, in step 1218 the baked photoresist 1308 is removed by a conventional chemical strip that dissolves the hardened photoresist and concurrently removes or "lifts off" the portion of the metal layer 1340 supported solely by the photoresist 1308, leaving behind metal to the exposed substrate 1302 as shown in FIG. 13*c*.

As indicated in step 1220, further processing steps may be performed on the wafer 1300, such as a DI wash following the resist strip step 1218 to remove residual contaminants on the wafer 1300, followed by an optional ashing step using an oxygen plasma atmosphere to oxidize and remove any remaining organic compounds on the wafer 1300.

As shown FIG. 14 and in an alternative embodiment, additional exemplary process steps 1210 are needed between steps 1208 and 1212 (FIG. 12) when a positive photoresist is used instead of a negative photoresist for the photoresist layer 1308 in FIGS. 13*a*, 13*b*. After exposure of the photoresist in step 1208 (FIG. 12), in step 1402 the wafer 1300 is baked in a convection oven filled with a catalyst, such as ammonia gas, to change the chemistry of the resist to permit reversal of the positive latent image to a negative latent image. Then, in step 1404 the photoresist 1308 is flood-exposed (no photomask 1312 is required) with UV light to effect reversal of the latent image in the resist 1308, as is well known art. After photoresist development in step 1212 (FIG. 12), areas of the photoresist exposed through the mask 1312 remain on the substrate 1302. Areas of the photoresist not exposed in step 1208 are removed. The slope generated in the resist by the concentric bands as described above is also reversed to leave an undercut 1332 (FIG. 13*b*) at edges of the resist pattern, which is desirable for an image reverse pattern in metal lift-off applications.

EXAMPLE

Figure 11:
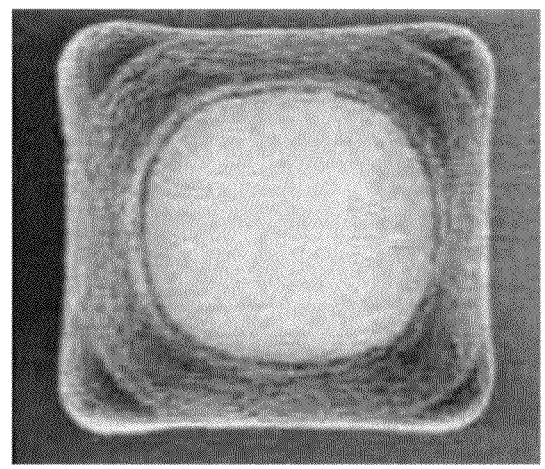
FIG. 11 illustrates an exemplary 1.2 um via formed using the double/single concentric band reticle feature design.

The experimental result of using concentric bands around existing reticle structures with a 0.30 um opaque (chrome) band, a 0.15 um transparent band, a 0.15 um opaque band and another 0.15 um transparent band (i.e., a "double/single" design) can generate a sloped photoresist sidewall angle of approximately 80 degrees without the need for flowing the resist is illustrated in FIG. 11. The resist used in this example was 4 micron thick NPR-8000 resist using a −4 micron focus, 365 nm (i-line) exposure of 390 mJ, 0.5 micron resolution limit, and a 60 second develop time, double puddle. Serifs were added at the corners of the bands help ensure that the corners of a rectangular via shape are preserved. This design has a turn-on exposure threshold in which the sidewall angle enhancement does not appear until the minimum exposure dose is reached. The concentric band design can generate a sloped resist sidewall profile at zero and positive focus settings during wafer exposure. Process controls using develop time, focus and exposure can be used to tailor the process window for the desired sidewall angle and critical dimension uniformity.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range.

It is understood that various changes in the details, materials, and arrangements of the parts which have been described and illustrated in order to explain the nature of this invention may be made by those skilled in the art without departing from the scope of the invention as expressed in the following claims.

I claim:

1. A reticle for use in a stepper having a resolution limit, the reticle comprising:
   at least one structure having a first transmissivity;
   a plurality of first bands bordering and surrounding the structure, each of the first bands having a second transmissivity different from the first transmissivity and a width smaller than the resolution limit of the stepper; and
   a plurality of second bands corresponding to the first bands, each of the second bands having the first transmissivity and a width smaller than the resolution limit of the stepper.

2. The reticle of claim 1 wherein an equal number of first and second bands are disposed on the reticle, an innermost one of the first bands has an inner edge that borders the structure to define an outer edge of the structure, the first bands and second bands are interleaved and non-overlapping, and at least one of the second bands does not completely surround the structure.

3. The reticle of claim 1 wherein an equal number of first and second bands are disposed on the reticle, an innermost one of the first bands has an inner edge that borders the structure to define an outer edge of the structure, the first bands and second bands are interleaved and non-overlapping, and the second bands surround the structure.

4. The reticle of claim 1 wherein the structure defines a via having a polygonal shape.

5. The reticle of claim 1 wherein the first bands have corners and each of the first bands includes serfs in at least one of the corners thereof.

6. The reticle of claim 1 wherein each of the second bands has substantially uniform width, and all of the second bands have the same width.

7. The reticle of claim 6 wherein each of the first bands has a substantially uniform width, an innermost one of the first bands has a first width and the first bands other than the innermost band have a second width less than the first width.

8. The reticle of claim 7 wherein first and second bands are interleaved, the second bands surround the structure, and the widths of all of the second bands are substantially the same as the second width.

9. The reticle of claim 8 wherein the second width is approximately 0.15 micron and the first width is approximately 0.3 microns.

10. The reticle of claim 7 wherein the stepper is adapted to utilize a light having a wavelength for exposing photoresist using the reticle to pattern the photoresist, and the first and second widths and the widths of the second bands are less than the wavelength of the exposure light.

11. The reticle of claim 10 wherein the reticle is intended for use in i-line steppers and the first and second widths and the widths of the second bands are greater than 0.1 micron.

12. The reticle of claim 1 wherein the transmissivity of the first bands is substantially zero (opaque), and the transmissivity of the structure and the second bands is substantially 100% (transparent).

13. A method of making a device comprising the steps of:
   providing a stepper having a resolution limit;
   depositing a layer of photoresist on a layer of material to be patterned;
   exposing the photoresist to an exposure light in the stepper using a reticle to form a latent image of the reticle in the exposed photoresist, the reticle having at least one structure thereon with a first transmissivity, a plurality of first bands bordering and surrounding the structure, each of the first bands having a second transmissivity different from the first transmissivity and a width smaller than the resolution limit of the stepper, and a plurality of second bands corresponding to the first bands, each of the second bands having the first transmissivity and a width smaller than the resolution limit of the stepper;
   developing the latent image in the exposed photoresist; and
   etching the material layer using the developed photoresist as an etch mask.

14. The method of claim 13 wherein the structure defines an opening to be formed in the layer of material by the etching step, an equal number of first and second bands are disposed on the reticle, an innermost one of the first bands has an inner edge that borders the structure to define an outer edge of the structure, the first and second bands are interleaved and non-overlapping, and at least one of the second bands does not completely surround the structure.

15. The method of claim 13 wherein the structure defines an opening to be formed in the layer of material by the etching step, an equal number of first and second bands are disposed on the reticle, an innermost one of the first bands has an inner edge that borders the structure to define an outer edge of the structure, the first bands and second bands are interleaved and non-overlapping, and the second bands surround the structure.

16. The method of claim 13 wherein the layer of material is an insulating layer.

17. The method of claim 13 wherein the first bands have corners and each of the first bands includes serfs in at least one of the corners thereof.

18. The method of claim 13 wherein the exposure light used by the stepper has a wavelength, and the first and second widths and the widths of the second bands are less than the wavelength of the exposure light.

19. The method of claim 13 wherein the reticle is intended for use in i-line steppers and the first and second widths and the widths of the second bands are greater than 0.1 micron.

20. The method of claim 13 wherein the transmissivity of the first bands is substantially zero (opaque), and the transmissivity of the structure and the second bands is substantially 100% (transparent).

21. A method of making a device comprising the steps of:
providing a stepper having a resolution limit;
depositing a layer of photoresist on a layer of insulating material to be patterned;
exposing the photoresist to an exposure light in the stepper using a reticle to form a latent image of the reticle in the exposed photoresist, the reticle having at least one transparent structure thereon defining an opening to be formed in the layer of insulating material, a plurality of opaque non-overlapping first bands having a width smaller than the resolution limit of the stepper and bordering and surrounding the structure, and a plurality of transparent non-overlapping second bands having a width smaller than the resolution limit of the stepper and equal to in number and interleaved with the first bands, the second bands also surrounding the structure;
developing the latent image in the exposed photoresist; and
etching the insulating material layer using the developed photoresist as an etch mask to form at least the opening in the layer of material.

22. The method of claim 21 wherein the widths of each of the first and second bands are substantially uniform, an innermost one of the first bands has a first width and the first bands other than the innermost band have a second width less than the first width, and the widths of all of the second bands are substantially the same as the second width.

23. The method of claim 21 wherein the exposure light used by the stepper has a wavelength, and the first and second widths and the widths of the second bands are less than the wavelength of the exposure light.

24. The method of claim 21 wherein the exposure light is approximately 365 nm, the second width is approximately 0.15 micron and the first width is approximately 0.3 microns.

25. The method of claim 21 wherein the developed photoresist has sloped sides.

26. A method of making a device comprising the steps of:
providing a stepper having a resolution limit;
depositing a layer of photoresist on a substrate;
exposing the photoresist to an exposure light in the stepper using a reticle to form a latent image of the reticle in the exposed photoresist, the reticle having at least one opaque structure thereon defining an opening to be formed in the photoresist, a plurality of transparent non-overlapping first bands having a width smaller than the resolution limit of the stepper and bordering and surrounding the structure, and a plurality of opaque non-overlapping second bands having a width smaller than the resolution limit of the stepper and equal to in number and interleaved with the first bands, the second bands also surrounding the structure;
developing the latent image in the exposed photoresist to expose portions of the substrate corresponding to the at least one structure, the developed photoresist having sloped sidewalls surrounding the exposed portions of the substrate;
depositing a layer of metal on the developed photoresist and exposed portions of the substrate; and
removing the photoresist and the layer of metal on the developed photoresist.

27. The method of claim 26, wherein the photoresist is a negative photoresist.

28. The method of claim 26 further comprising the steps of:
baking the exposed photoresist in a catalytic atmosphere to reverse the latent image in the photoresist; and
flooding the baked photoresist with the exposure light, the photoresist as deposited being a positive photoresist.

29. The method of claim 26 wherein the widths of each of the first and second bands are substantially uniform, an innermost one of the first bands has a first width and the first bands other than the innermost band have a second width less than the first width, and the widths of all of the second bands are substantially the same as the second width.

30. The method of claim 26 wherein the exposure light used by the stepper has a wavelength, and the first and second widths and the widths of the second bands are less than the wavelength of the exposure light.

31. The method of claim 26 wherein the layer of metal is deposited by sputtering.

32. The method of claim 30 wherein the metal is a gold alloy.

* * * * *